United States Patent [19]

Ozaki

[11] Patent Number: 4,689,442
[45] Date of Patent: Aug. 25, 1987

[54] PRINTED CIRCUIT BOARD AND METHOD OF MANUFACTURING SAME

[75] Inventor: Risuke Ozaki, Kokubunji, Japan

[73] Assignee: O. Key Printed Wiring Co., Ltd., Tokyo, Japan

[21] Appl. No.: 814,400

[22] Filed: Dec. 30, 1985

[30] Foreign Application Priority Data

Feb. 18, 1985 [JP] Japan .................................. 60-028462

[51] Int. Cl.$^4$ ............................................. H05K 1/00
[52] U.S. Cl. ..................................... 174/68.5; 29/846; 29/852; 361/386; 361/397; 361/412; 361/424
[58] Field of Search ............... 174/68.5; 361/397–398, 361/400, 406, 409, 412, 414, 386, 424; 29/831, 846, 852; 408/118, 201, 204

[56] References Cited

U.S. PATENT DOCUMENTS

| | | | |
|---|---|---|---|
| 2,775,148 | 12/1956 | Campbell | 408/118 X |
| 2,952,579 | 9/1960 | Merriman | 174/68.5 |
| 3,052,749 | 9/1962 | Snapp et al. | 361/412 X |
| 3,263,023 | 7/1966 | Staley | 174/68.5 |
| 3,302,067 | 1/1967 | Jackson et al. | 361/414 |
| 3,470,612 | 10/1969 | Helms | 174/68.5 X |
| 3,546,775 | 12/1970 | Lalmond et al. | 361/414 X |
| 3,638,573 | 2/1972 | Campbell | 174/68.5 X |
| 3,647,585 | 3/1972 | Fritzinger et al. | 174/68.5 X |
| 3,895,435 | 7/1975 | Turner et al. | 361/414 X |
| 4,057,101 | 11/1977 | Ruka et al. | 361/386 X |
| 4,067,104 | 1/1978 | Tracy | 361/412 X |
| 4,221,925 | 9/1980 | Finley et al. | 174/68.5 |

OTHER PUBLICATIONS

Fugardi, F., McIntosh, C., Slayton, G., "Laser Drilled Holes in Fired Ceramic", IBM Discl., vol. 14, No. 10, 3/72, p. 2869.

Archey, W., Audi, R., Dallaire, R., "Producing Accurately Located, Well-Defined Holes in Fired Ceramic", IBM Discl., vol. 15, No. 4, p. 1280, 9/72.

Pilgram, H., "Ceramic Substrate with Lukevent Heat Exchange", IBM Discl., vol. 12, No. 5, 10/69, p. 728.

Renz, "Test Probe Contact Grid Translator Board", IBM Technical Disclosure Bulletin, vol. 21, No. 8, Jan. 1979, p. 3235.

Primary Examiner—Arthur T. Grimley
Assistant Examiner—Jane K. Lau
Attorney, Agent, or Firm—Birch, Stewart, Kolasch & Birch

[57] ABSTRACT

The present invention relates to a printed circuit board and to a method of manufacturing the same. The printed circuit board has a reinforcing panel glued to the surface of a resin board. The resin board is provided with at least one circuit layer and through holes. The reinforcing panel contains a core in a plate form and is made of at least one curved board and a metal board glued at least to one side of the core. The reinforcing panel is provided with resin holes, the resin holes are filled with resin, and a lead wire hole is provided through the center of the filled-in resin. The center line of the through hole and that of the lead wire hole are almost identical. The manufacturing method provides a lead wire hole through the center of each resin filled hole in a reinforcing panel by a drilling device assisted by a hole position designating means. Thereafter, the reinforcing panel and a resin board having at least one circuit layer and through holes are glued together keeping the center line of each through hole and that of each corresponding lead wire hole almost identical.

18 Claims, 17 Drawing Figures

FIG. 13(a)
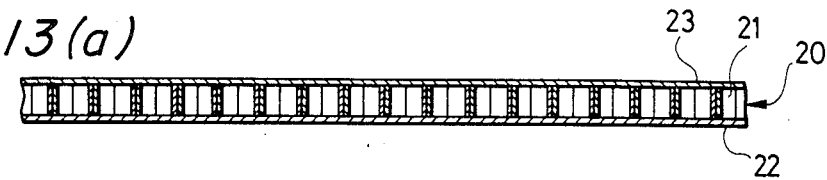
FIG. 13(b)
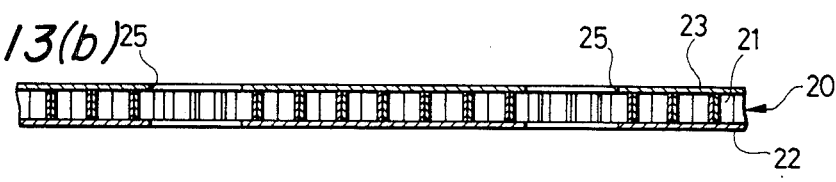
FIG. 13(c)
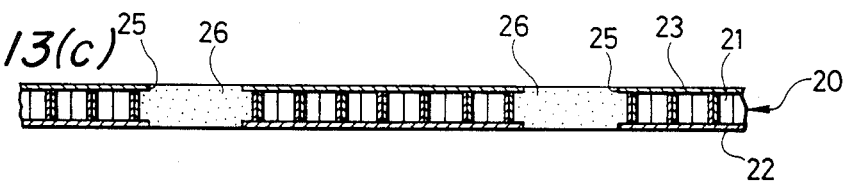
FIG. 13(d)
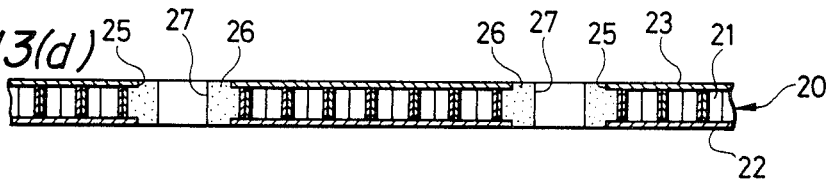
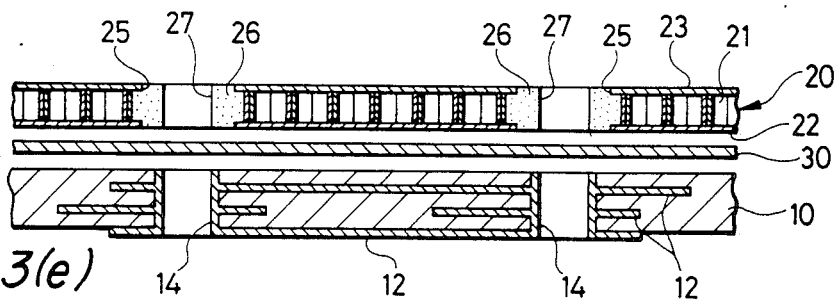
FIG. 13(e)

PRINTED CIRCUIT BOARD AND METHOD OF MANUFACTURING SAME

BACKGROUND OF THE INVENTION

1. Field of the Invention

The present invention relates to a printed circuit board and to a method of manufacturing the same.

2. Description of the Prior Art

So far, as printed circuit boards, there have been resin printed circuit boards having at least one circuit layer and through holes provided on a resin board.

As the compactization of electronic systems progresses, however, the density of mounting various components on the printed circuit board is increasing, and a greater number of components are being mounted on the printed circuit board. Since the resin printed circuit board has a low flexual rigidity, this allows the printed circuit board, to become easily warped. Thus in many cases it is impossible to insert a printed circuit board into the electronic system, or, even if it is possible to insert, the inserted printed circuit board may come in touch with the adjacent printed circuit boards, seriously affecting the whole circuit system. Also, as the components mounting density of the resin printed circuit board increases, the heat generated from those mounted components may increase, and an insufficient heat radiating ability of the resin printed circuit board permits the temperature of the resin printed circuit board and its adjacent area to rise. This invites a functional degrading of mounted components and is a serious problem at the moment. To avoid this kind of trouble, it has suggested that heat radiating fins may be attached to the mounted components, but this has a drawback in making the mounted components costly. In addition, the poor shielding effect of the resin printed circuit board makes it impossible to prevent noise.

SUMMARY OF THE INVENTION

It is an object of the present invention is to provide a printed circuit board having a larger flexual rigidity, a better heat radiation and an excellent shielding effect.

Another object of the present invention is to provide a method of manufacturing such a printed circuit board.

The printed circuit board of the present invention is characterized in that the reinforcing panel is glued to the surface of a resin board and at least one circuit layer is formed on the resin board. Also, the reinforcing panel contains a core in a plate form and is made of at least one curved board and a metal board glued at least to one side of the core.

Another printed circuit board of the present invention is characterized in that the reinforcing panel is glued to the surface of a resin board and at least one circuit layer and through holes are formed on the resin board. In addition, the reinforcing panel contains a core in a plate form and is made of at least one curved board and a metal board glued at least to one side of the core. Further, resin holes which are filled with resin are provided on the reinforcing panel and a lead wire hole is drilled through the center of the filled-in resin. Also, the center of the through hole and that of the lead wire hole are kept almost on an identical line.

In these printed circuit boards, the flexual rigidity is very high as the reinforcing panel is glued to the resin board, the generated heat can be released through the metal board of the reinforcing panel, and further they are free from the effect any electric field and magnetic field by means of the metal board installed.

Furthermore, in the manufacturing method of the printed circuit board of the present invention, resin holes are provided by a drilling device or by a press with the assistance of a hole position designating means on the reinforcing panel. The printed circuit board contains a core in a plate form and is made of at least a curved board and a metal board glued at least to one side of the core, resin is filled in the resin holes, a lead wire hole is drilled through the center of the filled-in resin by a drilling device assisted by the hole position designating means, and the reinforcing panel and a resin board on which at least one circuit layer and through holes are provided are glued together keeping the center of the through hole and that of the lead wire hole almost on an identical line.

In this method, the lead wire hole can be provided through the center of the resin hole with an utmost precision and ease, as both of the resin hole and the lead wire hole are drilled through with an assistance of the identical hole position designating means.

Other characteristic features and the benefits of the present invention may become clear through the following descriptions referring to the attached drawings.

BRIEF DESCRIPTION OF THE DRAWINGS

FIGS. 13(a)-13(e) are descriptive drawings. showing the manufacturing method of the printed circuit board shown in FIG. 2.

DETAILED DESCRIPTION OF THE INVENTION

Figure 1:
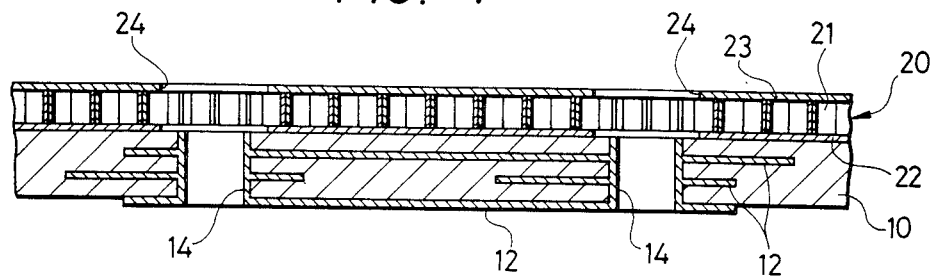
FIGS. 1 and 2 respectively are the sectional view showing a part of the printed circuit board related to the present invention.

Explanation of the printed circuit board is made based on FIG. 1. A honeycomb panel 20 is glued with adhesives to the surface of the resin board 10. Multiple circuit layers 12 and through holes 14 are formed on the resin board 10, and through holes 14 connect each circuit layer 12. The honeycomb panel 20 contains a honeycomb core 21 made of metal and the metal boards 22 and 23, and the honeycomb core 21 and composed of a multiple number of boards curved and placed parallel with the direction of the core's thickness. These boards are provided in a hexatagonal shape, while the metal boards 22 and 23 are glued to both sides of the honeycomb core 21. Lead wire holes 24 are provided on the honeycomb panel 20, and the center line of the lead wire hole 24 and that of the through hole 14 are almost identical, while the diameter of the lead wire hole 24 is larger than that of the through hole 14.

In this printed circuit board, its flexual rigidity is greatly upgraded as the honeycomb panel 20 is glued to the surface of the resin board 10, and its heat radiation is improved as the generated heat can be released by way of the honeycomb panel 20. Further, its shielding effect is good as it shuts off the effect of any electric field and magnetic field by the honeycomb panel 20.

Figure 2:
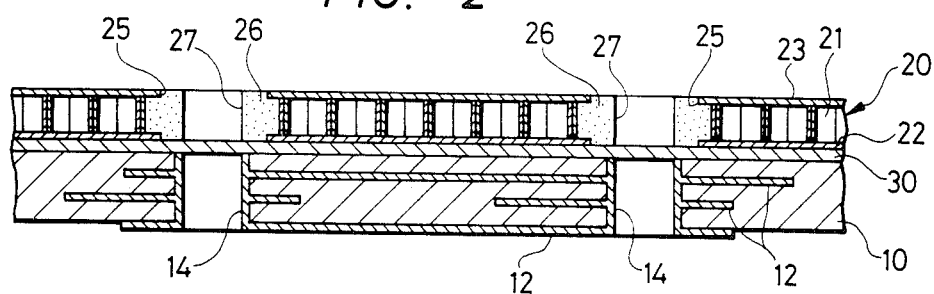
Figure 3:
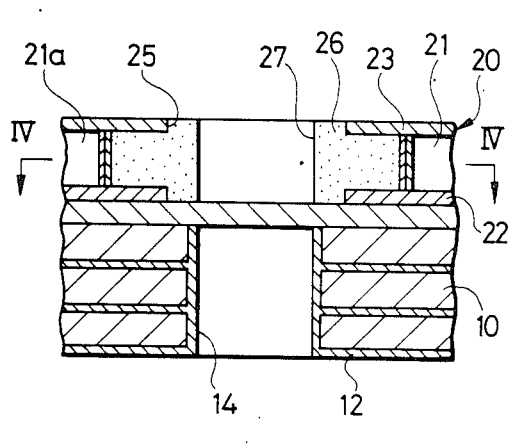
FIG. 3 is the detailed drawing of a part of the printed circuit board shown in FIG. 2.
Figure 4:
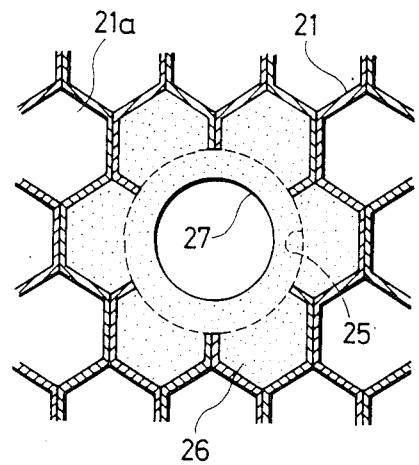
FIG. 4 is the cross section of IV—IV in FIG. 3.
Figure 5:
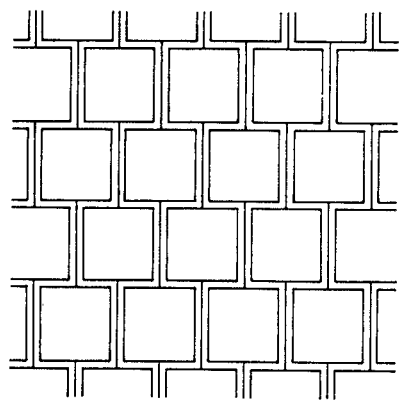
FIGS. 5 through 12 are the drawings exhibiting various types of the core.
Figure 6:
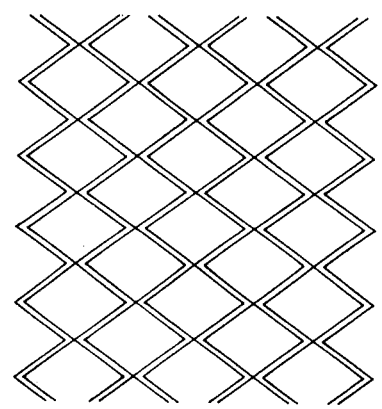
Figure 7:
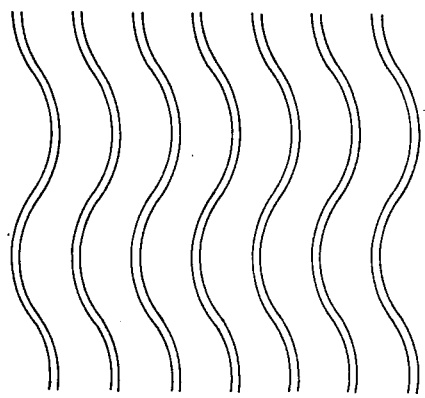
Figure 8:
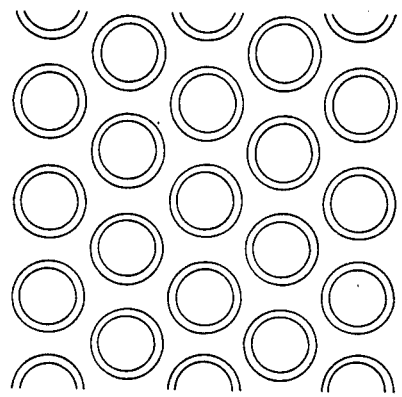

Another printed circuit board of the present invention is explained based on FIGS. 2 through 4. The resin board 10 and the honeycomb panel 20 are glued together by means of a bonding sheet 30. Resin holes 25 are provided on the honeycomb panel 20, resin 26 is filled in the resin holes 25 and the lead wire holes 27 are provided through the center of the filled-in resin 26, while the center line of the lead wire hole 27 is almost identical to that of the through hole 14. The rest is same to the printed circuit board shown in FIG. 1.

The above printed circuit board as well exhibits very high flexual rigidity and good heat radiation, in addition to its excellent shielding effect. When the resin hole 25 is drilled through the honeycomb panel 20, a part of the cell 21a of the honeycomb core 21 is cut off, and when the resin 26 is filled in the resin hole 25, the resin 26 is also filled into the cell 21a. Thus it puts the outer sides of the resin 26 in a state where the resin 26 is supported by the metal boards 22 and 23. Therefore, even if any outer force works on the resin 26, it does not permit the resin 26 to break away from the honeycomb panel 20.

Figure 9:
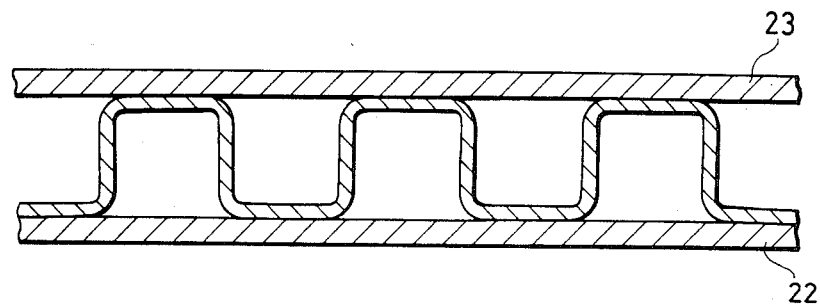
Figure 10:
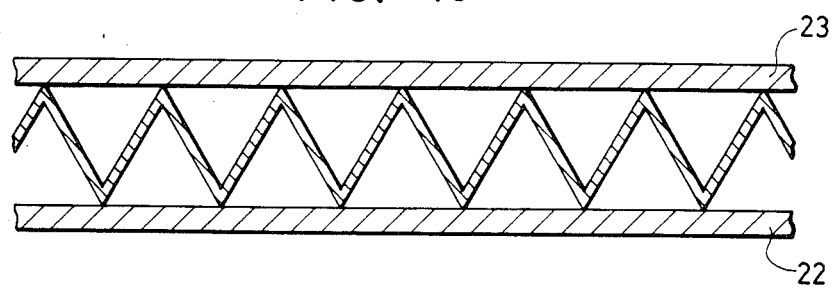
Figure 11:
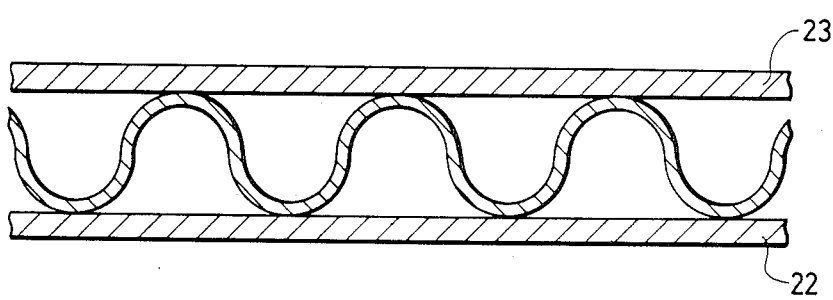
Figure 12:
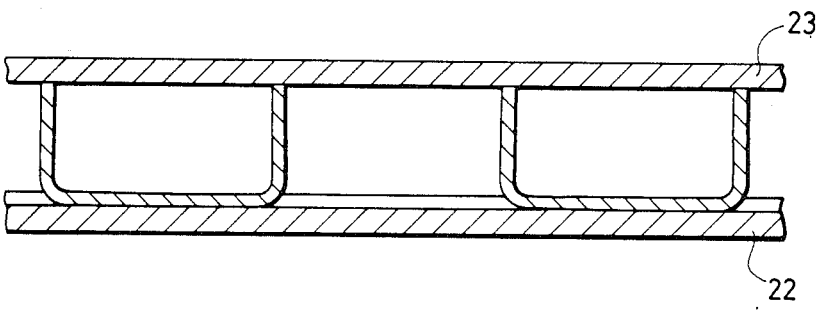

Further, although the metal boards 22 and 23 are glued to both sides of the honeycomb core 21 in the above embodiment, a metal board could be glued to only one side of the honeycomb core 21, or a metal board could be glued to one side of the honeycomb core 21 while gluing a resin board to the other side of the honeycomb core 21. Also, the above embodiment demonstrates the case where the core is the honeycomb core 21, but instead a core in a plate form and made of a plural number of boards curved and placed parallel with the direction of the core's thickness in a shape as shown in FIGS. 5 through 8 could be employed as the core. In addition, a core made of a single sheet of board corrugated in the form as shown in FIGS. 9 through 11 could be used as the core, or a core that is made of a single sheet of board having a plural number of cuts while the edges of the cuts being bent in a manner shown in FIG. 12 could also be applied as the core. Furthermore, instead of providing a multiple number of circuit layer 12 on the resin board 10 as shown in the above embodiments, a single circuit layer could be formed only on one side of the resin board 10, or on both sides of the resin board 10. Further, as for the metal boards 22 and 23, boards made of any kind of metal, such as aluminum boards, iron boards, copper boards, aluminum alloy boards, could be used. Aluminum boards do not contribute to the weight increase, iron boards make the cost lower, copper boards make the heat radiation very effective and aluminum alloy boards make the weight lighter. Moreover, holes parallel to the metal boards 22 and 23 could be bored through the honeycomb core 21 through which air is introduced for cooling. Also the pitch of the through hole 14 could be made equal to the pitch of the cell 21a or equal to any integer multiples of the pitch of the cell 21a. Further, although the resin board 10 and the honeycomb panel 20 are glued together by adhesives in the printed circuit board cited in FIG. 1, the resin board 10 and the honeycomb panel 20 could be glued together by a bonding sheet, and, conversely, though in the printed circuit board shown in FIG. 2 the resin board 10 and the honeycomb panel 20 are glued together by the bonding sheet 30, the resin board 10 and the honeycomb panel 20 could also be bonded together by adhesives.

Next, the manufacturing method of the printed circuit board shown in FIG. 2 is explained based on FIG. 13. First, an NC (numerical control) tape containing the data for the center position of the lead wire hole 27 aided by a NC drawing or a film draft. Next, fixing the honeycomb panel 20 shown in FIG. 13 (a) at the designated position on an NC drilling machine which drills holes in compliance with the instructions given by the NC tape, and fixing the first drill to the NC drilling machine, the resin holes 25 are drilled through the honeycomb panel 20 by drilling with the NC drilling machine (FIG. 13 (b)). Next, the resin 26 is filled into the resin holes 25 with an aid of silk screen printing or a roll, and then the resin 26 is hardened by means of heat drying or ultraviolet rays (FIG. 13 (c)). Next, with the honeycomb panel 20 fixed at the above-mentioned designated position on the above-mentioned NC drilling machine and after mounting the second drill which has a smaller diameter than the above-mentioned first one on the NC drilling machine, the lead wire holes 27 are drilled through the center of the resin holes 25 by the above-mentioned drilling machine assisted by the above-mentioned NC tape (FIG. 13 (d)). Next, a bonding sheet 30 is inserted in between the honeycomb panel 20 and the resin board 10 on which the circuit layers 12 and the through holes 14 are provided so as to keep the center lines of the lead wire holes 27 and those of the through holes 14 almost or subtantially identical (FIG. 13 (e)), and then the both are bonded together under heat by a press. Last, the finishing touch is given to the outer profile of the product.

In this manufacturing method, since the resin holes 25 and the lead wire holes 27 are provided by drilling both with an aid of the identical NC tape in order to have the center of the resin hole 25 and that of the lead wire hole 27 fall on an identical line, the drilling operation is very easy and the lead wire hole 27 can be provided at the center of the resin hole 25 with a high precision.

Further, although in this embodiment the resin holes 25 are drilled by an NC drilling machine, the resin holes 25 could well be provided by a drilling device of any other kind, and also the resin holes 25 could be provided through press processing by a press with a press die which is prepared with an aid of an NC tape. Also, an NC tape is employed as a hole position designating means in the above embodiment, but hole position designating means of any other kinds may be employed.

As explained in the above, the printed circuit board of the present invention is free from warping even if the number of mounted components increases on account of its very high flexual rigidity, so that it can be inserted into the electronic system with much ease and does not get in touch with adjacent printed circuit boards; moreover, it can withstand any severe condition of use. Further, on account of its effective heat radiation capacity its mounted components are free from any functional degradation, even though the density of mounted components gets higher and the heat generated from its mounted components increases, and it does not require to mount expensive components equipped with heat radiation fins. In addition, its excellent shielding effect enables it to prevent noises effectively. Therefore, the applicable range of printed circuit boards can be widely expanded.

Also the manufacturing method of the printed circuit board under the present invention provides the lead wire hole at the center of the resin hole with a high precision and with great ease, as both of the resin hole and the lead wire hole are provided with an aid of an identical hole position designating means. This results in a very high precision for the position of the lead wire hole, and accordingly insertion of components into the printed circuit board by an automated component installing machine with much ease becomes possible.

I claim:

1. A printed circuit board, comprising:
   a resin board having at least one circuit layer and a plurality of through holes formed therein;
   a reinforcing panel disposed on a surface of said resin board, said reinforcing panel comprising:
   a core in a plate form containing at least one curved board,
   a metal board disposed on at least one side of the core,
   a plurality of resin filled through holes provided in said reinforcing panel, and
   a lead wire hole disposed in the center of each of said resin filled holes;
   wherein the centers of each of said through holes and each of said lead wire holes are substantially on an identical line.

2. The printed circuit board of claim 1, wherein said reinforcing panel is glued to a surface of said resin board.

3. The printed circuit board of claim 1, wherein said metal board is glued to at least one side of said core.

4. The printed circuit board of claim 1, wherein said reinforcing panel is adhered to said resin board by a bonding sheet.

5. The printed circuit board of claim 1, wherein said metal board is selected from the group consisting of aluminum, iron, copper and aluminum alloy.

6. The printed circuit board of claim 1, wherein said core of said reinforcing panel has metal boards adhered to both sides of said core.

7. The printed circuit board of claim 1 wherein said core is made of metal.

8. The printed circuit board of claim 1, wherein said core contains a number of curved boards which are arranged parallel to the direction of the core's thickness.

9. The printed circuit board of claim 8, wherein said core is a honeycomb core.

10. The printed circuit board of claim 1, wherein said core consists of a single sheet of corrugated board.

11. A method of manufacturing a printed circuit board, comprising:
    attaching a reinforcing panel comprising a core in a plate form containing at least one curved board, a metal board attached to at least one side of the core and a plurality of resin-filled holes to a drilling device or to a press which are guided by a hole position designating means;
    drilling or pressing a lead wire hole through the center of pre-selected resin-filled holes; and
    adhering said reinforcing panel and a resin board having at least one circuit layer and a plurality of through holes formed therein so that the center of each of said through holes and the center of each of said lead wire holes are substantially on an identical line.

12. The method of claim 11, wherein a NC tape is employed as said hole position designating means.

13. A method of manufacturing a printed circuit board, comprising:
    attaching a reinforcing panel comprising a core in a plate form containing at least one curved board and a metal board attached to at least one side of the core to a drilling device or to a press assisted by a hole position designating means;
    drilling or pressing a plurality of resin holes at predetermined locations in said reinforcing panel;
    filled said resin holes with resin;
    hardening the resin;
    drilling or pressing a lead wire hold through the center of preselected resin-filled holes; and
    adhering said reinforcing panel and a resin board having at least one circuit layer and a plurality of through holes formed therein so that the center of each of said through holes and the center of each of said lead wire holes are substantially on an identical line.

14. The method of claim 13, wherein said drilling or pressing steps utilize a drill.

15. The method of claim 13, wherein said drilling or pressing steps utilize a press.

16. The method of claim 13, wherein said core is a honeycomb core.

17. The method of claim 13, wherein said resin is hardened with heat drying or ultraviolet rays.

18. The method of claim 13, wherein said lead wire hole is smaller than said resin-filled hole.

* * * * *